United States Patent [19]

Neiss

[11] 4,275,140
[45] Jun. 23, 1981

[54] PROCESS FOR PREPARATION OF HIGH OPACITY PHOTOSENSITIVE IMAGES

[75] Inventor: Melvin A. Neiss, Annandale, N.J.

[73] Assignee: E. I. Du Pont de Nemours and Company, Wilmington, Del.

[21] Appl. No.: 180,568

[22] Filed: Aug. 25, 1980

Related U.S. Application Data

[63] Continuation-in-part of Ser. No. 93,917, Nov. 13, 1979, abandoned, which is a continuation-in-part of Ser. No. 968,963, Dec. 12, 1978, abandoned.

[51] Int. Cl.$^3$ .............................................. G03C 11/12
[52] U.S. Cl. ................................... 430/254; 430/253; 430/281; 430/905
[58] Field of Search ............... 430/291, 292, 253, 905, 430/254, 281

[56] References Cited

U.S. PATENT DOCUMENTS

| | | | |
|---|---|---|---|
| 3,060,025 | 10/1962 | Burg et al. | 430/291 |
| 3,582,327 | 6/1971 | Boyd et al. | 430/291 |
| 3,649,268 | 3/1972 | Chu et al. | 430/291 |
| 4,081,282 | 3/1978 | Merrill et al. | 430/291 |

*Primary Examiner*—Jack P. Brammer

[57] ABSTRACT

Process for preparation of high opacity colored images on a photosensitive element surface which comprises bringing into surface-to-surface contact two elements, e.g., by laminating at elevated temperature, element (1) being a photosensitive element having tacky and non-tacky image areas, and element (2) being an adhesively supported pigment/binder layer, 75 to 95 parts by weight pigment, e.g., $TiO_2$, and 25 to 5 parts by weight elastomeric binder having a relatively low maximum tensile stress and a high elongation to break when cast as a film, and separating the two elements.

9 Claims, No Drawings

PROCESS FOR PREPARATION OF HIGH OPACITY PHOTOSENSITIVE IMAGES

This is a continuation-in-part of application Ser. No. 093,917, filed Nov. 13, 1979, now abandoned which is a continuation-in-part of application Ser. No. 968,963 filed Dec. 12, 1978, now abandoned.

DESCRIPTION

This invention relates to a process for preparing high opacity colored images and more particularly to a process wherein the high opacity colored images are formed on a photosensitive element having tacky and nontacky image areas.

BACKGROUND ART

High opacity, stencil images can be prepared by using silk screening techniques such as those described by Albert Kosloff in "The Art and Craft of Screen Process Printing," The Bruce Publishing Co., Milwaukee, Wisc. (1960). The silk screening process is, however, time consuming sometimes requiring an hour or more to prepare the final product. Additionally, silk screening is cumbersome, expensive and involves the use of solvents and thus may also involve subsequent pollution problems. A standard silk screen process requires the following steps: (1) expose the required image master on a photosensitive stencil film coated on a backing layer; (2) develop the film (wash-off solvents); (3) wash the film; (4) press the developed and washed film onto a silk screen of desired mesh size; (5) remove the film backing layer; (6) air dry the stencil on the silk screen; (7) register (6) on a substrate; (8) squeegee ink through the stenciled silk screen onto said substrate; and (9) air dry the final inked product. Although silk screening can produce a finished product with a high opacity image, the production of this high opacity requires a silk screen with a large mesh size. It is known, however, that the larger mesh size silk screens produce poorer image quality. Thus, the silk screen technique requires an operator judgment to properly balance image quality and opacity.

The use of photosensitive layers to prepare highly opaque images directly is desirable. The prior art describes other processes which directly use a photosensitive layer. These processes have certain disadvantages, however.

For example using the photosensitive compositions of U.S. Pat. No. 3,649,268, coated on a base support, exposed imagewise through an original transparency, and imaged by dusting or toning with suitable colorants (i.e., pigments), wherein the colorant adheres to the unpolymerized, tacky areas, it has not been possible to achieve high density, opaque images since sufficient pigment loading cannot be achieved. Burg et al. U.S. Pat. No. 3,060,025 teaches another imaging method whereby the colorants particles which are loosely bound on a separate support are transferred to a tacky photopolymer image by contact of the two surfaces. The Burg et al. invention is concerned with subsequent thermal transfer of the pigmented image and does not teach how to form high quality, high density, opaque images directly on the imagewise exposed photopolymer layer.

DISCLOSURE OF THE INVENTION

In accordance with this invention, there is provided a process for preparing high opacity, colored images on the surface of a photosensitive element which comprises the steps of:

(a) bringing into surface-to-surface contact two elements (1) and (2), element (1) being a photosensitive element having imagewise tacky and nontacky image areas, and element (2) being an adhesively supported pigmented layer, the pigmented layer comprising about 75 to 95 parts by weight of pigment and about 25 to 5 parts by weight of an elastomeric binder, the binder, when cast as an unsupported film, having a maximum tensile stress of less than 200 psi (14.06 kg/sq cm) and showing an elongation to break of at least 50%, and (b) separating the pigmented layer of element (2) from the photosensitive element (1) whereby the pigmented layer fails both cohesively and adhesively thereby remaining adherent substantially in its entire thickness solely to the tacky image areas of element (1).

The process of the invention is useful generally with any photosensitive element (1) that can form tacky and nontacky image areas upon imagewise exposure. The photosensitive element can be prepared from positive-working or negative-working compositions. Suitable positive-working compositions are photohardenable, e.g., photopolymerizable compositions disclosed, for example, in Chu and Cohen U.S. Pat. No. 3,649,268, and suitable negative-working photosensitive compositions which contain 0 to 40% by dry weight of a softener or plasticizer are disclosed, for example, in Abele and Grossa U.S. application Ser. No. 971,664, filed Dec. 21, 1978, which are incorporated by reference. A useful negative-working element (1) is described in Cohen and Fan U.S. Pat. No. 4,174,216, also incorporated by reference.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable compositions are: (1) those in which a photopolymerizable monomer is present alone or in combination with a compatible binder, or (2) those in which the photopolymerizable groups are attached to a polymer backbone which becomes activated to light and may then cross-link by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a cross-linked network can be produced.

If either a simple monomer or monomer-polymer binder is being used, the photosensitive layer preferably contains a free radical generating, addition polymerization initiator. The layer may also contain a plasticizing agent. Monomeric compounds may act as the plasticizer and/or a separate plasticizer compatible with the polymeric binder, if used, can be present in the image-bearing layer. Examples of plasticizers include: dialkyl phthalates, polyoxyethylene(4)monolaurylether, polyethylene glycol, triethylene glycol diacetate, alkyl phosphates, etc.

Suitable free radical initiated, chain propagating, addition polymerizable, ethylenically unsaturated compounds for use in the monomer or monomer-polymer binder photopolymerizable layers are described in U.S. Pat. Nos. 3,060,023, 3,261,686 and 3,380,831. Polymers for use in the monomer-polymer binder system and preferred free radical generating addition polymerization initiators are described in U.S. Pat. No. 3,060,023.

Photodimerizable materials useful in the invention are cinnamic acid esters of high-molecular weight polyols, polymers having chalcone and benzophenone type groups, and others disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in U.S. Pat. Nos. 3,469,982 and 3,418,295.

Preferred free radical generating addition polymerization initiators, activatable by actinic radiation, e.g., ultraviolet and visible radiation, are listed in U.S. Pat. No. 3,060,023 and the other patents referred to above.

The negative-working elements described in U.S. Pat. No. 4,174,216 comprise, in order, from top to bottom (1) a strippable cover sheet, (2) a photoadherent layer comprising a nontacky photohardenable material with ethylenically unsaturated or benzophenone type groups, (3) a tonable contiguous layer, e.g., a nonphotosensitive tacky organic elastomeric material which is tonable by application of particulate material, and (4) a sheet support. The negative-working element, therefore, has two layers, one of which is photopolymerizable, and the second layer is a nonphotosensitive tacky organic material.

The photosensitive element, 0.0003 to 0.001 inch (0.0076 to 0.025 mm), can be present on a surface such as a polymer film, plastic, metal or sheet such as paper, whereon it adheres. The photosensitive composition can be either laminated or coated on the surface under conditions known to those skilled in the art. A known protective film such as is described in U.S. Pat. No. 3,060,026, can be present on the photosensitive layer. The protective film, e.g., polyethylene terephthalate, polyethylene, etc., can be present during imagewise exposure but is removed prior to bringing the layer into surface-to-surface contact with pigmented layer (2).

The photosensitive element is exposed to actinic radiation, generally through a process transparency, e.g., a process negative or positive (an image-bearing transparency consisting solely of substantially opaque and substantially transparent areas where the opaque areas are substantially of the same optical density, the so-called line or halftone negative or positive).

Since most of the photosensitive compositions preferred in this invention generally exhibit their maximum sensitivity in the ultraviolet range, the radiation source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given photosensitive layer is a function of exposure time, type of radiation source used, and distance between the radiation source and layer surface. In general, exposure times range from 10 seconds to 10 minutes or more using standard commercial radiation sources.

The pigmented layer of element (2) which can be 0.0002 inch (0.005 mm) to 0.001 inch (0.025 mm) in thickness depending on the opacity and resolution requirements of the layer comprises about 75 to 95 parts by weight of pigment and about 25 to 5 parts by weight of an elastomeric binder which when cast as an unsupported film, has a maximum tensile stress of less than 200 psi (14.06 kg/sq cm) and shows an elongation to break of at least 50%, preferably at least 125%, measured by ASTM D412-75. Preferably the pigmented layer comprises about 90 parts by weight of pigment and about 10 parts by weight of the elastomeric binder.

Pigments that can be used in the pigmented layer include those disclosed in Chu et al. U.S. Pat. No. 3,620,726, e.g., pigmented particles having a size distribution within the range of 0.2 to 30 microns and not more than 50% of the particles are less than 1 micron equivalent spherical diameter, as defined in the patent. Other finely divided pigments known in the art can also be used.

The characteristics of the elastomeric binder are critical to the practice of the invention. The binder, when mixed with pigment, should form a flexible, cohesive and adherent layer and should be resistant to cracking, flaking, etc., during handling. The binder has elastic properties so as to form an unsupported film and yet be brittle enough to fracture imagewise during the inventive process. Useful binders are determind by measuring the tensile properties of an unsupported film made from the elastomeric binder according to the method described in ASTM D412-75. Elastomer binders useful in this invention, when formed into an unsupported film, 1.5 to 3.0 mm in thickness, possess a maximum tensile stress during the elongation to break of less than 200 psi (14.06 kg/sq cm) and an elongation to break of at least 50%, preferably 125% or more. Elastomeric binders include: poly(butadiene/styrene), preferably those wherein the butadiene component predominates, poly(butadiene/styrene)/polybutadiene, polybutadiene, and mixtures thereof, etc. The elastomeric binders are mixed in compatible solvents with pigment and are coated on a support to form element (2) described above.

Wetting agents, surfactants, dispersing agents and solvents of various types can be used to aid in the preparation of the pigmented layer as illustrated in the examples below. Generally, known wetting agents, surfactants, dispersing agents, etc., are present in the system in amounts up to about 1% by weight. Typically, the pigment is dispersed in water or another liquid under conditions of high shear aided by a small amount, e.g., up to about 0.15% by weight, of dispersing agent; followed by mixing with one or more suitable binders of the type described above and wetting agents prior to coating thereof.

The dispersing and mixing steps are standard procedures known to those skilled in the art as are the coating of the pigment/binder dispersion on suitable supports such as transparent films, e.g., polyesters, e.g., nonsubbed polyethylene terephthalate; polyamides, cellulosics, e.g., cellulose acetate, cellulose acetate butyrate, etc.; polyolefins, e.g., polyethylene, polypropylene, etc.

A preferred pigmented layer possesses necessary flexibility to withstand bending, without cracking during normal handling. This layer possesses both cohesive and adhesive relationships with respect to its support. The pigmented layer of element (2) is brought into surface-to-surface contact, e.g., by laminating, with the tacky image-bearing element (1). Lamination is accomplished at a temperature up to 116° C. After some cooling, preferably to room temperature, the pigmented layer is separated from the image-bearing element. The pigmented layer, i.e., pigment and elastomeric binder, must fracture or break sharply in the areas corresponding to the tacky image areas of the image-bearing element and, in addition, must separate substantially in its entire thickness from its support in order to leave sufficient pigment on the image surfaces to provide the necessary high opacity, e.g., transmission optical density greater than 0.22. The support of element (2) thus cannot adhere more strongly to the pigmented layer than the pigmented layer adheres to the tacky image areas. Images are produced with excellent quality (i.e., opacity, edge sharpness, etc.). In addition, the high opacity colored images can be produced more quickly than the images of the prior art (i.e., screen printing).

Best Mode for Carrying Out the Invention

The best mode is illustrated in Example 1 wherein a photosensitive element, preferably a supported photopolymerizable layer, containing tacky and nontacky image areas is brought into surface-to-surface contact with an adhesively supported pigmented layer, containing 90 parts by weight titanium dioxide pigment and 10 parts by weight of poly(butadiene(55)/styrene(45)) binder, by laminating at about 95° C. After cooling to room temperature, the two elements are separated leaving the pigment layer, i.e., pigment and elastomeric binder, adhered solely in the tacky image areas of the photopolymerizable layer as a high opacity white image.

Industrial Applicability

The invention is useful for the preparation of signs and exhibits wherein superior opacity and edge sharpness are required as compared to screen printing. The high opacity images can be made in any color, although white is preferred. It has been found that to the high opacity image can be applied toners of different color which adhere to the rough surface of the opaque image. Generally a protective overcoat or cover sheet is applied to the toned opaque image. In an embodiment, the opaque image, e.g., white is applied to an opaque substrate of a different color. In another embodiment, over the opaque image on a transparent substrate is applied a solid background color different from the opaque image color and the image is then viewed through the transparent substrate. In still another embodiment, the opaque image is applied to a transparent clear or transparent colored substrate. The image is then viewable from either side. High opacity images of any color can also be formed by applying over a white opaque image a layer of tacky photopolymer, imagewise exposing the photopolymer layer in register with the white opaque image and then applying transparent dyes or pigments to the tacky image areas. The reverse pigmented image remaining on the pigmented layer can be used to form an image by adhering the layer to a tacky surface.

EXAMPLES

The following examples illustrate the invention wherein the parts and percentages are by weight. The tensile properties of the elastomeric binders in the following examples, where possible, are measured by the method of ASTM D412-75. The binders, either dispersed as latices or dissolved in suitable solvents, are poured into 3.5 to 4.0 inches (8.89 to 10.16 cm) petri dishes and the solvent is evaporated to yield dry thicknesses between 60 to 120 mils (~1.52 to 3.05 mm). The films are then dried at about 70° F. (21° C.) at less than 10% relative humidity for about one week. Samples of about 0.5 inch×3.25 inches (1.27 cm×8.26 cm) are die cut from each film and the tensile properties are measured on a Tensile Tester, Model TTB, Instron Engineering Co., Quincy, Mass. following the above ASTM procedure and the intructions for this instrument.

EXAMPLE 1

The following ingredients are mixed to prepare a pre-dispersion for use in preparing a white opaque layer to demonstrate the imaging system of this invention:

| Ingredient | Amount (g) |
| --- | --- |
| Distilled water | 2500.0 |
| Surfactant-25% aqueous solution (Polywet ® ND-2, anionic oligomeric surfactant, Uniroyal Chemical) | 15.0 |
| $TiO_2$ (TiPure ® R931, Du Pont Co.) | 2500.0 |

These ingredients are thoroughly blended using a high shear mixer (e.g., Cowles Dissolver, Model IVG-1, Morehouse Ind., Inc., Fullerton, Calif.), at 3000 rpm in a suitable container. A sample from this pre-dispersion and the following ingredients are mixed to obtain a coating dispersion (48% solids).

| Ingredient | Amount (g) |
| --- | --- |
| Pre-dispersion as described above | 4360.5 |
| Surfactant as described above | 26.1 |
| Ammonium hydroxide (29% aqueous solution) | 82.4 |
| Synthetic latex, (poly[butadiene (55)/styrene(45)], FR-S ® 2001, Firestone Co.), maximum tensile stress about 53 psi (3.73 kg/sq cm), elongation to break about 1590% | 484.5 |
| Wetting agent, 50% aq. soln. of $F(CF_2CF_2)_n-(CH_2)_2-S-(CH_2)_2-CO_2^-Li^+$ wherein n is 3, 4 or 5, | 2.2 |
| Total | 4955.7 |

The ingredients are stirred together for about one hour. A sample of this final dispersion is coated on a 0.001 inch (0.025 mm) thick polyethylene terephthalate film support using a 0.002 inch (~0.051 mm) doctor knife and the resulting coating is dried. The dried opaque white coating is found to be about 0.00065 inch (0.0165 mm) thick (coating weight about 258 mg solids/dm²).

A tacky photopolymer composition similar to that described in Chu et al., U.S. Pat. No. 3,649,268, Example 1, coated on a polyethylene terephthalate film support and having a transparent cover sheet (polyethylene terephthalate) is imagewise exposed using a nuArc ® "Flip Top" Plate Maker, Model FT26L xenon light source. This exposure hardens the photopolymer layer in the exposed areas but leaves the unexposed areas in a tacky state. The cover sheet is then removed, and the opaque white film prepared above is laminated over the imaged photopolymer layer at about 93° C. After cooling to room temperature the laminate formed is stripped apart. The opaque white $TiO_2$-containing layer in substantially its entire thickness remains adhered to the tacky image areas yielding an excellent, high density white image thereon. The image is sharp and clear, no background stain (i.e., adherence to hardened photopolymer) is noted. Additionally, the white imaging film prepared from the coating dispersion is flexible, non-tacky and can be rolled up and stored without a cover sheet.

EXAMPLE 2

This is a control example illustrating a binder outside the scope of the invention. A pre-dispersion as prepared in Example 1 is mixed with the following ingredients to obtain a control coating dispersion.

| Ingredient | Amount (g) |
| --- | --- |
| Pre-dispersion described in Example 1 | 180.0 |
| Polyethylene oxide (M.W. 100,000), 10 g in 30 g ethanol, maximum tensile stress about 5 psi (0.35 kg/sq cm), elongation to break about 5%. (This material forms a poor film whose tensile properties are difficult to measure.) | 30.0 |
| Wetting agent as described in Example 1 | 4.5 |

The pre-dispersion and the polyethylene oxide/ethanol slurry each are prepared before combination with the wetting agent. The total coating dispersion is stirred for about one hour and is then coated as described in Example 1. The image which is formed has poor cohesive strength, halos are noted around the image areas, and background stain is also noted. In addition, the white coating dispersion is brittle and tends to flake off its support.

EXAMPLE 3

The following ingredients are mixed together to prepare a pre-dispersion.

| Ingredient | Amount (g) |
| --- | --- |
| $TiO_2$ as described in Example 1 | 46.6 |
| Methylene chloride | 151.3 |
| Wetting agents: | |
| Aerosol ® TR-70 [bis(tridecyl)ester of sodium sulfosuccinic acid, American Cyanamid Co.] | 1.4 |
| GAFAC ® RE-610 (free acid of a complex organic phosphate ester, GAF Corp.) | 0.7 |

These ingredients are placed in a suitable container and are mixed using the Cowles Dissolver described in Example 1. The following ingredients are then added to form a coating dispersion:

| Ingredient | Amount (g) |
| --- | --- |
| Mixture of 20% by weight butadiene (60%)/styrene (40%) copolymer (Ameripol ® 1513) and 80% by weight cis-polybutadiene (Ameripol ® CB-221) (Ameripol ® is the registered trademark of B. F. Goodrich Co.), maximum tensile stress about 23 psi (1.62 kg/sq cm), elongation to break greater than 2500%. | 5.2 |
| Methylene chloride | 64.7 |

The polymeric binder is dissolved in the methylene chloride before being added to the pre-dispersion. A coating is prepared as described in Example 1 and this coating is used to prepare an image using the exposed photopolymer layer described in Example 1. An excellent image, equivalent in quality to that of Example 1, is achieved.

EXAMPLE 4

The following ingredients are mixed together to prepare a pre-dispersion.

| Ingredient | Amount (g) |
| --- | --- |
| Quinacridone Magenta, C.I. No. 122 | 322.9 |
| Dispersant (Daxad ® 11, polym. sodium salts of alkyl sulfonic acid, W. R. Grace Co.) | 21.4 |
| Distilled water | 1384.7 |

These materials are mixed for ten minutes at 3000 rpm using the Cowles Dissolver described in Example 1. The following ingredients are then mixed to prepare three coating dispersions as follows:

| | Amount (g) | | |
| --- | --- | --- | --- |
| Ingredient | Disp.-A | Disp.-B | Disp.-C |
| Pre-dispersion as described above | 200.0 | 200.0 | 200.0 |
| Surfactant described in Example 1 | 0.5 | 0.5 | 0.5 |
| $NH_4OH$ (29% aq.) | 1.5 | 1.5 | 1.5 |
| Latex as described in Example 1 | 8.8 | 17.6 | 26.4 |
| Wetting agent as described in Example 1 | 2.0 | 4.5 | 4.5 |
| Approx. wt. % pigment | 90.0 | 82.0 | 77.0 |

These dispersions are then coated on film supports and the coated supports are used to image tacky photopolymer images as described in Example 1. In each of the three samples an excellent, high opacity magenta image is obtained.

EXAMPLE 5

Example 1 is repeated varying the concentration of pigment ($TiO_2$) in the pigmented layer as shown below. Each sample is used to form an image on a tacky photopolymer image as described in Example 1. The following results are obtained:

| Sample | $TiO_2$ (%) | Image Results |
| --- | --- | --- |
| A | 82.4 | Good quality |
| B | 91.4 | Good quality |
| C | 94.5 | Fair quality, slight chalking propensity |
| D | 97.5 | Poor quality, high propensity to chalk |

EXAMPLE 6

This is a control example illustrating binders outside the scope of the invention. Opaque white (TiO$_2$-containing) imaging layers are prepared according to Example 2 except for the binder ingredient. These films are used to image a photopolymer tacky image as described in Example 1. In every case, the results are inferior with a ragged or haloed image, background stain, etc. The binders used are shown below:

| Sample | Binder | Image Results | Max. Tensile Stress in psi (kg/sq cm) | Elongation to Break (%) |
|---|---|---|---|---|
| A | Polyvinylacetate | Poor - rounded or full images - brittle imaging layer | * | * |
| B | Polyvinylbutyral | Pockmarked image | 2549 (179.19) | 125 |
| C | Cellulose acetate butyrate | Fuzzy image | >1336 (>93.92) | 25 |
| D | Methyl methacrylate/ethyl acrylate/methacrylic acid (66/29/5) | Extreme overlapping of image and non-image areas, brittle imaging layer | ** | ** |

*Too brittle to die stamp, no measurements made
**Poor film former, no measurements possible

EXAMPLE 7

The following ingredients are mixed to prepare a pre-dispersion as described in Example 1:

| Ingredient | Amount (g) |
|---|---|
| Distilled Water | 1500.0 |
| Surfactant as described in Example 1 | 9.0 |
| TiO$_2$ as described in Example 1 | 1500.0 |

A sample from this pre-dispersion is then mixed with the following ingredients to obtain a suitable coating dispersion:

| Ingredient | Amount (g) |
|---|---|
| Pre-dispersion as described above | 180.0 |
| Ammonium hydroxide (29% aq. soln.) | 3.4 |
| Synthetic latex (polybutadiene, 50% solids, FR-S ® 272, Firestone Co.), maximum tensile stress about 83 psi (5.83 kg/sq cm), elongation to break about 130% | 20.0 |
| Wetting agent as described in Example 1 | 3.0 |

These ingredients are stirred and coated on a film support as described in Example 1 and further used to image a tacky photopolymer element as described in that Example. The resulting product is an excellent, high density, sharp, clear white image.

EXAMPLE 8

The pre-dispersion described in Example 7 is employed in the coating dispersion for this example which is prepared from the following ingredients:

| Ingredient | Amount (g) |
|---|---|
| Pre-dispersion described in Example 7 | 180.0 |
| Ammonium hydroxide (29% aq. soln.) | 3.4 |
| Synthetic latex [polybutadiene (71%)/styrene (29%)], 59.5% solids, FR-S ® 2003, Firestone Co., maximum tensile stress about 109 psi (7.66 kg/sq cm), elongation to break about 145% | 20.0 |
| Wetting agent as described in Example 1 | 3.0 |

These ingredients are mixed, coated and used to image a tacky photopolymer element as described in Example 1. The resulting product is an excellent, high density, sharp, clear white image.

EXAMPLE 9

A negative-working photosensitive element is made according to the teaching of Example 9 of Abele and Grossa, U.S. application Ser. No. 971,664 filed Dec. 21, 1978. This element comprises a 0.007 inch (0.18 mm) thick polyethylene terephthalate support sheet, a photosensitive layer of about 0.004 inch (0.10 mm) containing 2 g polymethacrylic acid ethylester, 0.65 g polyglycol hexadecyl ether, 0.15 g triethylene glycol diacetate and 0.2 g each of 2,4,6-trimethyl-3,5-bis(carbethoxy)-1,4-dihydropyridine, 2,6-dimethyl-4-ethyl-3,5-bis(carbethoxy)-1,4-dihydropyridine, 2,6-dimethyl-4-n-propyl-3,5-bis(carbethoxy)-1,4-dihydropyridine, and 2,6-dimethyl-4-benzyl-3,5-bis(carbethoxy)-1,4-dihydropyridine, and 0.6 g each of 2,2',4,4',5,5'-hexaphenylbiimidazole, 2,2'-bis(2-chlorophenyl)-4,4',5,5'-tetraphenylbiimidazole and 2,2'-bis(2-methoxy phenyl)4,4',5,5'-tetraphenylbiimizadole, and a 0.0001 inch (0.0003 mm) polyethylene terephthalate cover sheet. This element is given an exposure for about ten minutes through an image-bearing transparency by means of the exposure device described in Example 1. The cover sheet is then removed, and a white opaque layer made according to Example 1 is laminated at about 25° C. to the imagewise exposed photosensitive layer. The laminate formed is then stripped apart leaving the TiO$_2$-containing layer in substantially its entire thickness adhered to the tacky exposed image areas yielding a high density white negative image.

EXAMPLE 10

Example 8 is repeated except that the synthetic latex is polybutadiene (54%)/styrene (46%), FR-S ® 2000, Firestone Co., maximum tensile stress about 136 psi (9.56 kg/sq cm), elongation to break about 2163%. The ingredients are mixed, coated and used to image a tacky photopolymer element as described in Example 1. The resulting product is an excellent, high density, sharp, clear white image.

EXAMPLE 11

This is another control example illustrating binders outside the scope of this invention. Opaque (TiO$_2$-containing) imaging layers are prepared according to Example 2 except for the binder which is set forth below. These films are used to image a photopolymer tacky image as described in Example 1. In every case, the results are inferior when compared to the results achieved by the invention.

| Sample | Binder | Max. Tensile Stress in psi (kg/sq cm) | Elongation to Break (%) |
|---|---|---|---|
| A | Poly[styrene(90%/butadiene(10%)] Darex® 632L, Grace Chemical Corp. | * | * |
| B | Polyisoprene, Hartex® 103, Firestone Co. | >322 (>22.64) | >1250 |
| C | Poly[styrene(63%)/butadiene(37%)] Naugatex® 3755 Uniroyal Co. | 556 (39.09) | 970 |
| D | Poly(styrene/isoprene/styrene) 86% isoprene, 14% styrene, Kraton® 1107, Shell Oil Co. | >412 (>28.96) | >1970 |

*Poor film former, no measurements possible

EXAMPLE 12

Two photopolymer elements similar to those described in Example 1 are prepared and exposed as described therein. The image on Sample A is developed by lamination with a white opaque film prepared as described in Example 1. The other Sample B is imaged by dusting TiO$_2$ over the tacky-nontacky areas as taught in U.S. Pat. No. 3,649,268. After imaging, both samples are covered by laminating a supported tacky photopolymer layer over the image areas, uniformly exposing to harden and removing the support. The visible transmission optical densities of both elements are measured with the following results:

| Sample | Transmission Optical Density |
|---|---|
| A | 0.94 |
| B (control) | 0.22 |

This example demonstrates that high opacity is achieved by the process of this invention but not by known dusting techniques.

EXAMPLE 13

Three negative-working elements are prepared as follows:

I. Nontonable Photopolymerizable Layer

A coating solution of a photopolymerizable composition is prepared by mixing together the following ingredients:

| Ingredient | Weight (g) |
|---|---|
| Polymethyl methacrylate (MW 200,000-300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4″)-(naptho-1′,2′;4,5) 1,2,3-triazol-2″-sulfonic acid phenyl ester | 2.20 |
| 2-Mercaptobenzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm$^2$ when dried on a clear polyethylene terephthalate film having a thickness of 0.0005 inch (0.0015 cm) which is surface treated by electrostatic discharge at 0.07 coulombs/ft$^2$ (0.093 coulombs/m$^2$).

II. Tonable, Tacky Elastomer Contiguous Layer

A coating solution is prepared by mixing together the following ingredients:

| Ingredient | Weight (g) |
|---|---|
| Random copolymer of styrene/butadiene (40/60) | 19.75 |
| Cis-polybutadiene (Mooney Viscosity 55-60) | 79.75 |
| Tetra-bis-[methylene 3-(3′,5′-di-t-butyl-4′-hydroxyphenyl) proprionate] methane | 0.50 |
| Methylene chloride to make | 1333.30 |

This solution is coated on polyethylene terephalate film having a releasable layer of polydimethyl siloxane coated thereon to give a coating weight of about 125 mg/dm$^2$ when dried.

III. Laminating Procedure

The supported photopolymerizable layer (I) and the supported tonable, tacky elastomer contiguous layer (II) are laminated in surface-to-surface relationship at room temperature with a pressure of about 40 psi (2.81 kg/dm$^2$).

IV. Operations for Preparation of a Sign Element

The laminates (III) are further handled as follows;

The polyethylene terephthalate film with the siloxane release coating is stripped from the tonable, tacky layer and the resulting element is then laminated at 100° C. to a 0.0012 inch (0.003 cm) thick paper support (identified as Baryta Paper, marketed by the Intermill Corporation, Belgium). The element is then nonimagewise exposed for about 30 seconds to the light source of Example 1, the exposure being made through the electrostatic discharge treated, clear polyethylene terephthalate film. After the exposure is made, the exposed element is taped securely to a suitable flat surface, ad the clear polyethylene terephthalate film cover sheet is stripped by pulling at one corner with an even, continuous motion at an angle of about 135°–180°. The resulting exposed, photopolymerized image photoadheres to the electrostatic discharge treated film and is removed with the film thus exposing equivalent areas of the tacky, elastomer contiguous layer on the paper support. The bared tacky area is dusted by the procedure described in Example 12 with a cyan toner described in Example 1 of U.S. Pat. No. 4,215,193. An overall cyan background surface is thus obtained.

The second laminate (III) is laminated to the cyan surface as described above in this Example and is imagewise exposed through a negative target using the same exposure procedure described above in this Example. The cover sheet is removed as described above and the opaque white film described in Example 1 is laminated over the image surface at about 25° C. The laminate formed is stripped apart. The opaque white, TiO$_2$-containing layer in substantially its entire thickness remains adhered to the tacky image areas yielding an excellent high density white image on a cyan background.

The third laminate (III) is laminated to the white-imaged surface and is given an overall exposure as described above to protect the finished sign element.

I claim:

1. A process for preparing high opacity, colored images on the surface of a photosensitive element which comprises the steps of:
   (a) bringing into surface-to-surface contact two elements (1) and (2), element (1) being a photosensitive element having imagewise tacky and nontacky image areas, and element (2) being an adhesively supported pigmented layer, the pigmented layer comprising about 75 to 95 parts by weight of pigment and about 25 to 5 parts by weight of an elastomeric binder, the binder, when cast as an unsupported film, having a maximum tensile stress of less than 200 psi and showing an elongation to break of at least 50%, and
   (b) separating the pigmented layer of element (2) from the photosensitive element (1) whereby the pigmented layer fails both cohesively and adhesively thereby remaining adhered substantially in its entire thickness solely to the tacky image areas of element (1).

2. A process according to claim 1 wherein the pigmented layer comprises about 90 parts by weight of pigment and about 10 parts by weight of an elastomeric binder.

3. A process according to claim 1 or claim 2 wherein the elastomeric binder is selected from the class of poly(butadiene/styrene), poly(butadiene/styrene)/polybutadiene, polybutadiene and mixtures thereof.

4. A process according to claim 1 wherein the photosensitive element (1) prior to imaging is a supported photopolymerizable layer containing at least one free radical initiated, chain propagating, addition polymerizable compound containing at least one terminal ethylenic group, and an addition polymerization initiator activatable by actinic radiation.

5. A process according to claim 1 wherein the photosensitive element (1) prior to imaging consists essentially of a layer comprising a nontacky photohardenable material with ethylenically unsaturated or benzophenone type groups and a contiguous layer of a nonphotosensitive tacky, organic elastomeric material.

6. A process according to claim 1 wherein the pigment is titanium dioxide.

7. A process according to claim 1 wherein the photosensitive element contains at least one plasticizer.

8. A process according to claim 1 wherein the reverse pigmented image remaining on element (2) is adhered to a tacky surface.

9. A process according to claim 1 wherein elements (1) and (2) are brought into surface-to-surface contact by laminating at a temperature up to 116° C. and separated after some cooling.

* * * * *